United States Patent [19]

Chen

[11] Patent Number: 5,308,594
[45] Date of Patent: May 3, 1994

[54] EDGE-HEAT-SINK TECHNIQUE FOR ZONE MELTING RECRYSTALLIZATION OF SEMICONDUCTOR-ON-INSULATOR FILMS

[75] Inventor: Chenson K. Chen, Weston, Mass.

[73] Assignee: Massachusetts Institute of Technology, Cambridge, Mass.

[21] Appl. No.: 943,257

[22] Filed: Sep. 10, 1992

Related U.S. Application Data

[60] Division of Ser. No. 238,311, Aug. 30, 1988, Pat. No. 5,160,575, which is a continuation-in-part of Ser. No. 124,346, Nov. 20, 1987, Pat. No. 4,889,583, which is a continuation of Ser. No. 805,117, Dec. 4, 1985, abandoned.

[51] Int. Cl.$^5$ ............................................. C30B 13/32
[52] U.S. Cl. .................................. 117/222; 118/641; 373/139; 117/933
[58] Field of Search .................. 156/620.7, 620.71; 422/245, 250; 373/139, 154; 118/728, 725

[56] References Cited

U.S. PATENT DOCUMENTS

| | | | |
|---|---|---|---|
| 3,158,505 | 11/1964 | Sandor | 428/336 |
| 3,539,759 | 11/1970 | Spiro et al. | 118/725 |
| 3,627,590 | 12/1971 | Mammel | 437/82 |
| 4,113,547 | 9/1978 | Katz et al. | 118/725 |
| 4,135,027 | 1/1979 | Anthony et al. | 156/620.71 |
| 4,277,320 | 7/1981 | Beguwala et al. | 204/164 |
| 4,280,989 | 7/1981 | Seimiya et al. | 423/344 |
| 4,371,421 | 2/1983 | Fan et al. | 156/624 |
| 4,435,447 | 3/1984 | Ito et al. | 437/241 |
| 4,448,632 | 5/1984 | Akasaka | 156/603 |
| 4,479,846 | 10/1984 | Smith et al. | 156/603 |
| 4,493,977 | 1/1985 | Arai et al. | 118/725 |
| 4,503,807 | 3/1985 | Nakayama et al. | 118/725 |
| 4,535,227 | 8/1985 | Shimizu | 118/725 |
| 4,990,374 | 2/1991 | Keely et al. | 118/725 |
| 5,033,407 | 7/1991 | Mizuno et al. | 118/725 |
| 5,160,575 | 11/1992 | Chen | 156/620.7 |

FOREIGN PATENT DOCUMENTS

| | | | |
|---|---|---|---|
| 0071731 | 2/1983 | European Pat. Off. | |
| 61-219130 | 9/1986 | Japan | 118/725 |
| 62-4314 | 1/1987 | Japan | 118/725 |
| 62-4315 | 1/1987 | Japan | 118/725 |
| 62-282431 | 12/1987 | Japan | 156/620.71 |
| WO89/04386 | 5/1989 | PCT Int'l Appl. | |

OTHER PUBLICATIONS

Robinson et al., "Large Area Recrystallization of Polysilicon with Tungsten-Halogen Lamps", *Jrnl. Crystal Growth*, vol. 63 (1983) pp. 484–492.

Geis et al., "Zone-Melting Recrystallization of Si Films with a Moveable-Strip Heater Oven", *Jrnl. Electro. Chem. Tech.*, Dec. 1982.

Pinizzotto R. F., "Microstructural Defects in Lazer Recrystallized Graphite Strip Heater . . . Systems: A Status Report", *Jrnl Crys. Growth*, vol. 63 (1983) pp. 559–582.

Fan et al., "Graphite-Strip-Heater Zone-Melting Recrystallization of Si Films" *Jrnl. Crys. Growth*, vol. 63 (1983) pp. 453–483.

*Primary Examiner*—Anthony McFarlane
*Attorney, Agent, or Firm*—Hamilton, Brook, Smith & Reynolds

[57] ABSTRACT

Wafers of silicon-on-insulator (SOI) produced by the zone melting recrystallization technique are known to exhibit warping and edge defects which prohibit their use in automated silicon wafer processing equipment. These deficiencies arise from excess heat buildup at the periphery of the wafer because the wafer edge acts as a barrier to heat transfer. Dissipation of heat from the edge by varying the heat dissipation efficiency of the environment about the periphery of the wafer allows wafers with substantially fewer defects to be produced.

9 Claims, 3 Drawing Sheets

EDGE-HEAT-SINK TECHNIQUE FOR ZONE MELTING RECRYSTALLIZATION OF SEMICONDUCTOR-ON-INSULATOR FILMS

The Government has rights in this invention pursuant to Grant Number F19628-85-0002 awarded by the Department of the Air Force.

This application is a division of application Ser. No. 07/238,311, filed on Aug. 30, 1988.

CROSS-REFERENCE TO RELATED APPLICATION

This application is a division of application Ser. No. 07/238,311, filed Aug. 30, 1988, now U.S. Pat. No. 5,160,575, which is a continuation-in-part of application Ser. No. 124,346, filed Nov. 20, 1987, now U.S. Pat. No. 4,889,583, and which is entitled: "Improved Capping Technique for Zone-Melting Recrystallization of Insulated Semiconductor Films", which in turn is a continuation of application Ser. No. 805,117 filed Dec. 4, 1985, now abandoned, and is entitled: "Capping Technique for Zone-Melting Recrystallization of Insulated Semiconductor Film", both by Chen and Tsaur, assigned to the assignee of the present application and incorporated herein by reference.

BACKGROUND OF THE INVENTION

This invention relates generally to the conversion of amorphous or polycrystalline semiconductor materials to substantially single crystal semiconductor material by a process known as zone-melting recrystallization.

From transistors to very large scale integration of complex circuitry on a single chip, the field of solid state electronics has been built largely upon the abundant non-metallic element silicon. Large diameter single crystal boules of silicon are sliced into wafers on which dopants, insulators and conductors are applied using a variety of processes. Over the past few years, a major effort has been devoted to developing a new silicon-based technology involving the preparation of very thin films of pure single crystal silicon on the the order of one-half micron thick, compared to the one-half millimeter thickness of typical silicon wafers. This emerging technology is called silicon-on-insulator (SOI) technology because the thin silicon film is supported by an insulating substrate. An efficient, reliable and economical process for producing thin film single crystal silicon has eluded researchers until now.

In comparison to device performance in bulk silicon, SOI promises significant advantages:

(1) improved speed performance in discrete devices and circuits resulting from reduced parasitic capacitance;

(2) simplified device isolation and design layout, yielding potentially higher packing densities; and (3) radiation hard circuits for space and nuclear application. In addition, new SOI technologies may also be utilized for three-dimensional integration of circuits.

At present, there is one relatively mature SOI technology, silicon-on-sapphire (SOS). However, the commercial utilization of SOS has been severely limited by its high cost, relatively poor crystalline quality, and difficulty in handling and processing in comparison to bulk Si.

Recently, a new SOI technology called zone-melting recrystallization (ZMR) based on standard silicon wafers rather than sapphire crystals has exhibited the potential for displacing SOS and for utilization on a much larger scale by the semiconductor industry. The development of ZMR, however, has been frustrated by processing problems. The interface between the molten silicon and adjacent silicon dioxide layers gives rise to the so-called silicon beading phenomenon during ZMR which can fracture the $SiO_2$ cap and lead to defects in the crystalline structure of the silicon. A solution to this problem is the subject of the above-referenced parent application S.N. 805,117.

A second obstacle to the commerical utilization of ZMR has been the presence of excessive edge defects and warping which result from heat buildup about the periphery of the wafer during processing. These defects require post-ZMR processing to both improve the cosmetic appearance and prepare the crystal for automated semiconductor processing.

SOI by the ZMR technique is produced by recrystallizing a fine-grained Si film on an insulating substrate. A typical sample structure consists of a silicon wafer coated with a 1-micron, thermally-grown $SiO_2$ insulating layer, a half micron polycrystalline silicon (poly-Si) layer formed by low pressure chemical vapor deposition (LPVCD), capped by a 2-micron layer of CVD $SiO_2$. The last layer forms a cover to encapsulate the polysilicon film constraining it while the film is being recrystallized.

SOI by the ZMR technique is described in a paper entitled "Zone Melting Recrystallization of Silicon Film With a Movable Strip Heater Oven" by Geis et al., *J. Electrochem. Soc. Solid State Science and Technology*, Vol., 129, p. 2812 (1982).

The sample is placed on a lower graphite strip and heated to a base temperature of 1100°-1300° in an argon gas ambient. Silicon has a melting point of about 1410° C.; $SiO_2$ has a higher melting point, about 1710° C. Additional radiant energy is typically provided by a movable upper graphite strip heater which produces localized heating of the sample along a strip to a temperature between the two melting points. The upper heater scans the molten zone across the sample leaving behind a recrystallized monocrystalline SOI film beneath the $SiO_2$ cap. A major problem with this procedure arises from excessive heat buildup about the periphery of the wafer creating macroscopic defects and making the wafer unsuitable for use in automated Si processing equipment.

SUMMARY OF THE INVENTION

The present invention provides a method for reducing the edge defects in SOI wafers by dissipating heat about the periphery of the wafer. This heat dissipation is accomplished by increasing the effective thermal conductivity of the environment in thermal contact with the periphery while simultaneously processing the wafer by ZMR. The environment may include, for example, an annylar support member serving as a heat sink or a gas stream flowing across the periphery. The ambient gas pressure may also be employed to fine-tune the heat dissipation efficiency.

One embodiment of the invention provides a method of adjusting the heat dissipation efficiency about the periphery of SOI wafers by placing the wafer on a thermally conductive annular member which not only supports the wafer but also evenly dissipates heat transferred to it from the wafer periphery. By varying the dimensions and/or density of the annular member, the dissipating efficiency may be adjusted or varied along the periphery.

Another method of adjusting heat dissipation involves supporting the wafer on an annular support and heat dissipating member and then varying the ambient gas pressure to affect differential heat dissipation efficiency between the central portion of the wafer and those portions about the periphery in contact with the support.

Yet another method of adjusting heat dissipation about the periphery of the wafer includes flowing a stream of gas about the wafer periphery which acts both to dissipate heat about the wafer edge as well as to reduce the heat input from the upper strip heater near the wafer edge when the middle of the strip heater is close to the wafer edge.

BRIEF DESCRIPTION OF THE DRAWINGS

The drawings are briefly described as follows:

FIG. 4b is a cross-sectional view along lines 4b—4b of FIG. 4a.

FIG. 4c is a sectional view taken along lines 4c—4c of FIG. 4a.

DESCRIPTION OF THE PREFERRED EMBODIMENTS

The following description generally relates to silicon semiconductors. While silicon is by far the most important semiconductor material in use today, the invention is applicable by analogy in the epitaxial growth of other semiconductor materials such as gallium arsenide and germanium.

Figure 1:
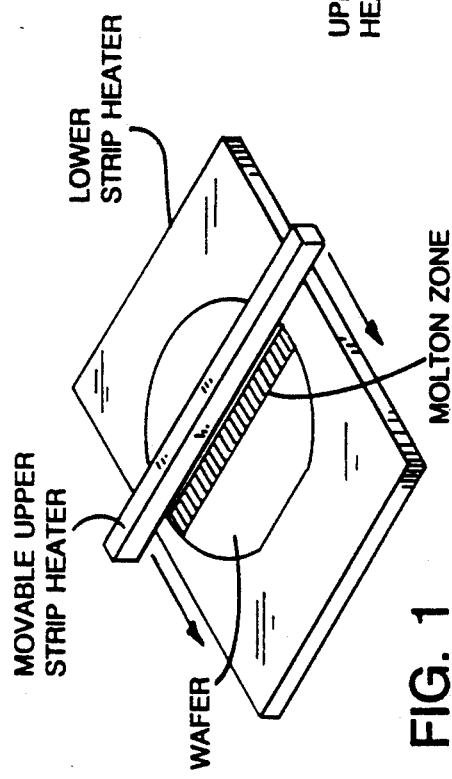
FIG. 1 is a schematic isometric view of an encapsulated SOI undergoing ZMR.

FIG. 1 illustrates the thermal components of a typical ZMR apparatus, namely, the stationary lower strip heater and the movable upper strip heater. The lower strip heater is formed by a thin rectangular sheet of graphite. Opposite ends of the strip heater are connected in circuit to a source of electrical current in order to achieve controlled heating of a single wafer with formed SOI structure. The movable upper heater typically comprises an elongated graphite strip with a square cross-section of about 1 sq mm in area. The length of the upper heater more than spans the wafer and is spaced about 1 mm above the wafer surface. The ends of the upper heater are connected in an electrical circuit for resistive heating.

Figure 2:
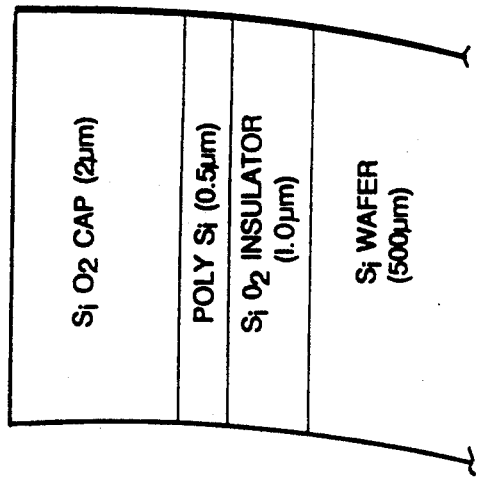
FIG. 2 is a schematic diagram of the cross-section of a typical SOI structure.

The layers of an encapsulated SOI wafer are diagramed in cross-section in FIG. 2. A typical sample consists of a silicon wafer coated with a 1-micron thermally-grown $SiO_2$ layer, a 0.5-micron poly-Si layer formed by LPCVD, capped by a 2-micron layer of CVD $SiO_2$. Prior to the process disclosed in the parent application, an additional 30 nm cladding layer Si-rich $Si_3N_4$ was deposited by RF sputtering or CVD on top of the $SiO_2$ cap to promote wetting of the molten Si film on $SiO_2$ during ZMR. The otherwise useless nitride layer is obviated by the parent invention.

The wafer of FIG. 2 is placed cap-side-up on the lower strip heater (FIG. 1). The sample is heated to a base temperature of 1100°–1300° C., typically in an argon gas ambient. The upper strip heater is heated to about 2200° C. The strip-like zone beneath the rod is heated to a temperature just above the poly-Si melting point, e.g., 1410° C., well below the melting point of $SiO_2$, thus melting the polysilicon in a band beneath the solid $SiO_2$ cap. As the upper heater moves across the face of the wafer, the molten zone is scanned across the sample leaving behind a recrystallized SOI film. In this manner, the polycrystalline silicon layer is converted to a single crystal layer suitable for semiconductor devices.

Unfortunately, however, wafers produced by this technique are known to exhibit macroscopic edge defects and significant warping. In the prior art method, the wafer is supported in the ZMR chamber on three or four graphite shims, each with a small area in contact with the wafer and heated to a uniform temperature. During ZMR, wafers supported in this way are irradiated by the upper strip heater, adjusted so that a narrow molten zone, extending from edge to edge is created.

Figure 3A:
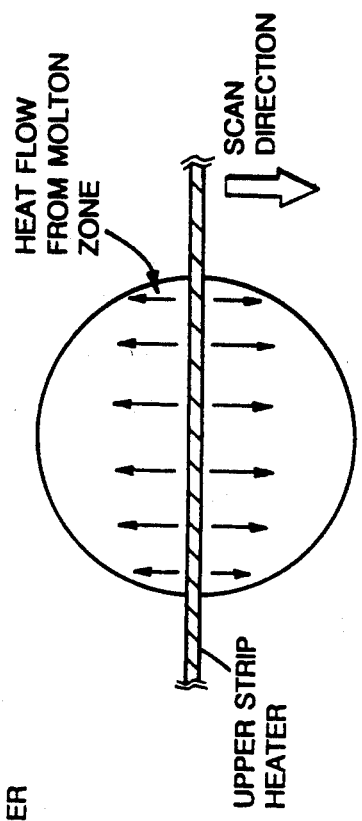
FIG. 3a is a top view diagram indicating heat flow in an SOI wafer when the strip heater is about midrange across the wafer.
Figure 3B:
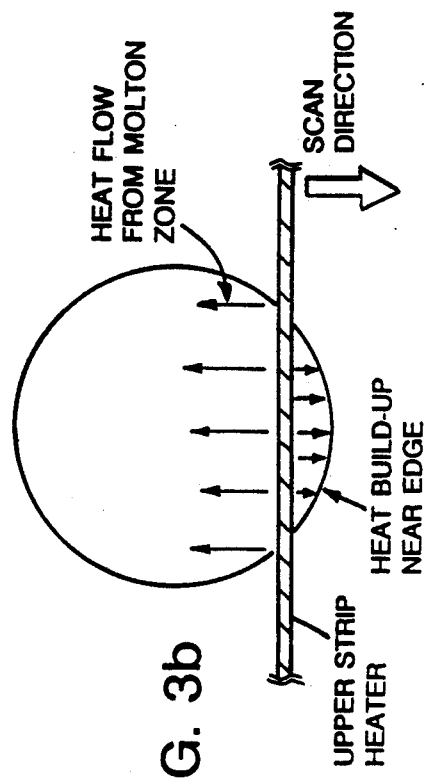
FIG. 3b is a top view diagram indicating edge limited heat flow and consequent heat buildup at the edge of an SOI wafer when the strip heater is about an end of its scan.

As shown in FIG. 3a, thermal energy is absorbed by central portions of the wafer is dissipated symmetrically within the substrate. Toward the edge of the crystal, however, as shown in FIG. 3b, the heat absorbed by the substrate appears to be less efficiently dissipated because the substrate edge acts as a thermal barrier. This phenomenon is particularly acute at the substrate edge under the middle of the strip heater at the ends of its scan. Consequently, the temperature of the wafer edge will be higher than the interior portions and at a power level that properly heats the SOI film in the center of the wafer, substrate melting may occur at the edges, thereby causing macroscopic defects and warping and making the wafer unsuitable for processing in automated Si processing equipment.

Figure 4C:
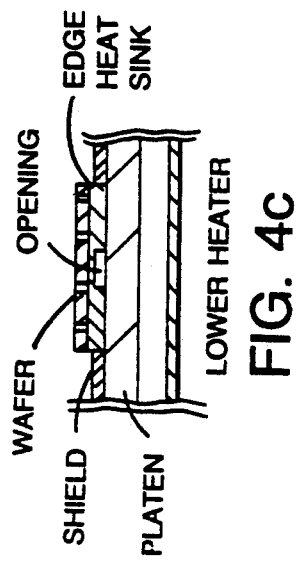
Figure 4B:
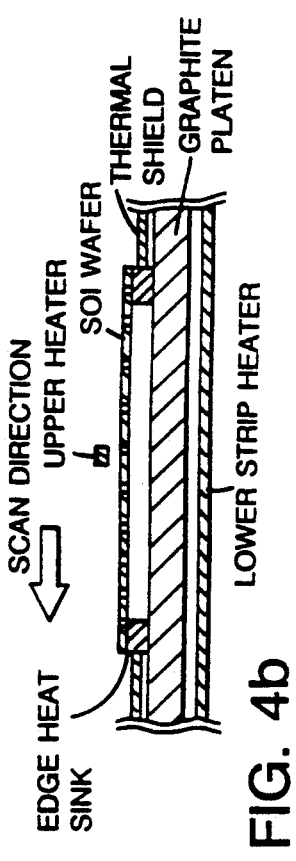
Figure 4A:
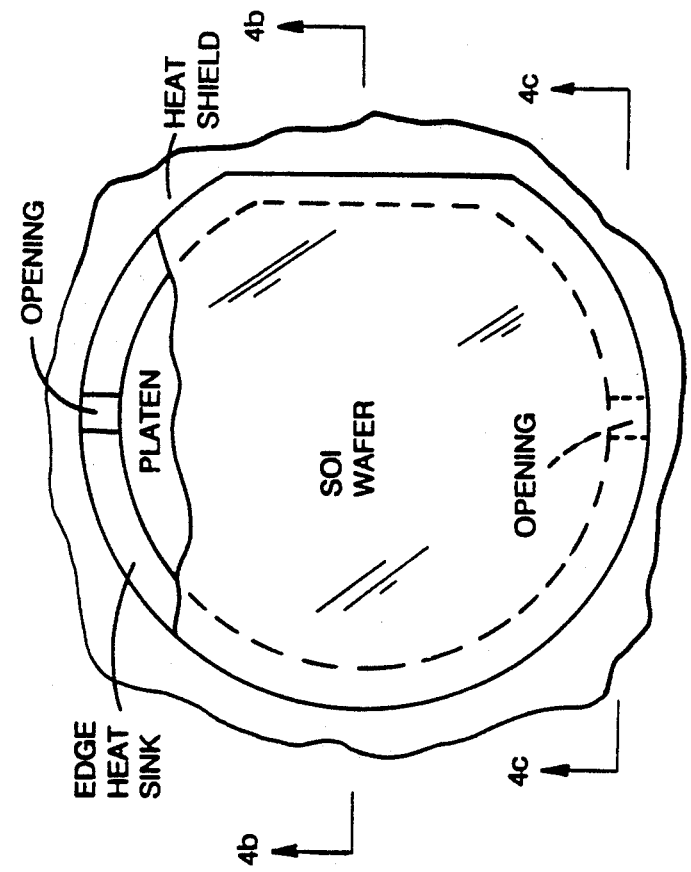
FIG. 4a is plan view of an SOI wafer in a ZMR system, supported by an annular heat sinking member, a portion of the wafer being broken away to reveal the underlying heat sink.

As shown in FIG. 4a, an SOI crystal in a ZMR system is supported by an annularly-shaped heat sink which is in turn supported by a graphite platen above a lower strip heater. It should be appreciated that the annular support could be a separate component, as diagramed or an integral component of the platen. The support effectively eliminates the edge defect problems by increasing the thermal capacity of the edges through contact with a heat sink support. That is, excess heat buildup is prevented by permitting a heat flow path away from the edges. Furthermore, the degree of heat sinking can be selected by varying the dimensions and composition of the support; e.g., a denser support structure and greater area overlap provide greater heat sinking capacity and superior thermal contact respectively. Materials for use in the heat sink member may also be selected based on their thermal conductivity. Preferrably, as shown in FIGS. 4a and 4c the support further includes a transverse opening or openings allowing the interior of the annulus to be in gaseous communication with the environment outside the annulus when supporting a wafer. This arrangement avoids disturbance of the substrate by gas escaping from the interior of the annulus when the ZMR chamber is evacuated prior to use. During use, the gaseous communication tends to reduce heat build-up in the disc shaped chamber under the wafer. A heat shield with an opening for the heat sink may also be employed to avoid excessive heat loss of the platen about the wafer periphery.

Another embodiment of this invention allows controlling the heat dissipation of the wafer using an annular heat sinking and support member and varying the ambient gas pressure. Thermal energy absorbed by the substrate may be transferred by contact with the surrounding ambient gas. The efficiency of this dissipation mode is a function of the ambient pressure such that a higher gas pressure results in more efficient dissipation. A vacuum, for example, is an excellent thermal insulator; higher ambient gas pressure makes the atmosphere about the substrate a more efficient thermal conductor. The edges of the wafer, however, have two modes of heat dissipation: transfer through the ambient gas and the supporting heat sink structure. Reducing the pressure in this embodiment results in relatively less heat dissipation at the center portion than the edges supported by the heat sink structure.

Prior to the scan of the upper strip heater, the relative temperature of the edge to the center of the wafer may also be adjusted to compensate for a phenomenon known as thermal roll off. When the SOI sample is placed on a uniformly heated graphite platen as illustrated in FIG. 4b, the platen will become hotter directly below the sample because the sample has a lower emissivity than graphite and therefore radiates less than those portions of the platen not covered by the sample. This gives rise to the thermal roll-off from the center to the edge of the sample. In practice, thermal shields as shown may be used to reduce the heat loss from the graphite not directly beneath the SOI sample to minimize roll-off. Alternatively, or in combination with the use of the shields, the gas pressure may also be increased, to improve the thermal contact of the SOI sample to the platen at the wafer periphery relative to the wafer center via the annular support, thereby allowing heat from the platen to increase the temperature of the wafer periphery relative to the wafer center to reduce this roll-off.

Figure 5:
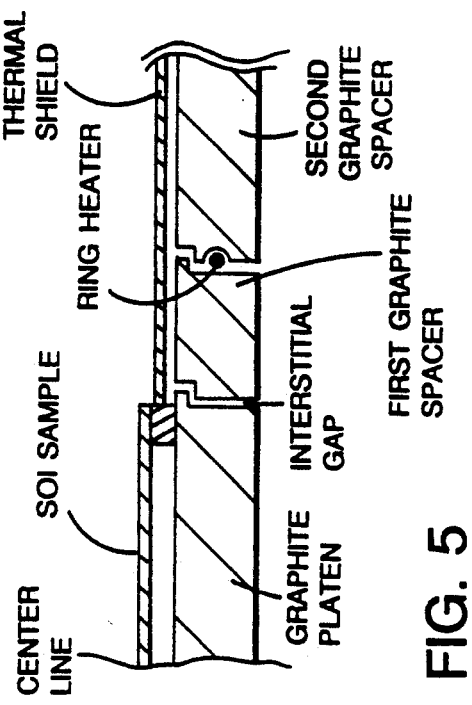
FIG. 5 is a radial sectional view of a portion of an embodiment of a graphite plate with a ring heater supporting an annular heat sink.

A concentric ring heater in the graphite platen located near the wafer periphery may also be employed to avoid roll off by increasing the temperature of the periphery during the initial heating. In FIG. 5 an arrangement of a graphite platen with a ring heater is shown. This embodiment provides an interlocking coupling between the platen and graphite spacers. The interstitial gap between the first spacer and the platen creates a thermal break which discourages heat conduction loss from regions inside the wafer periphery. The ring heater may be positioned outside the periphery of the annular support in the second spacer as shown to add heat to the first graphite spacer, further discouraging heat loss from beneath wafer edge and actively heating the periphery.

Another embodiment of this invention permits actively adjusting the heat dissipation efficiency of the periphery of the crystal by flowing a gas stream whose temperature may be selected, about the periphery. This embodiment is shown in a top view in FIG. 6 and in cross-section in FIG. 7.

Figure 7:
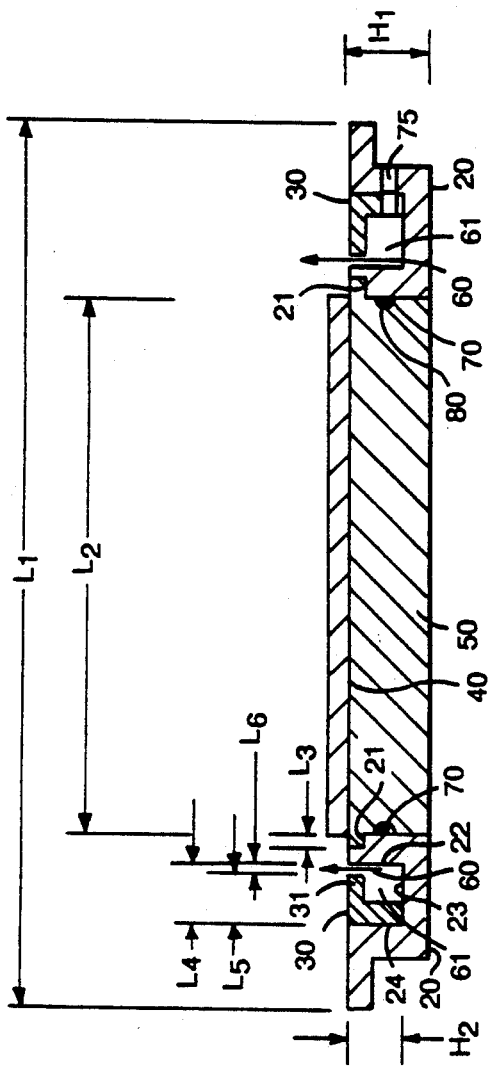
FIG. 7 is a cross-sectional view taken along lines 7—7 of FIG. 6.
Figure 6:
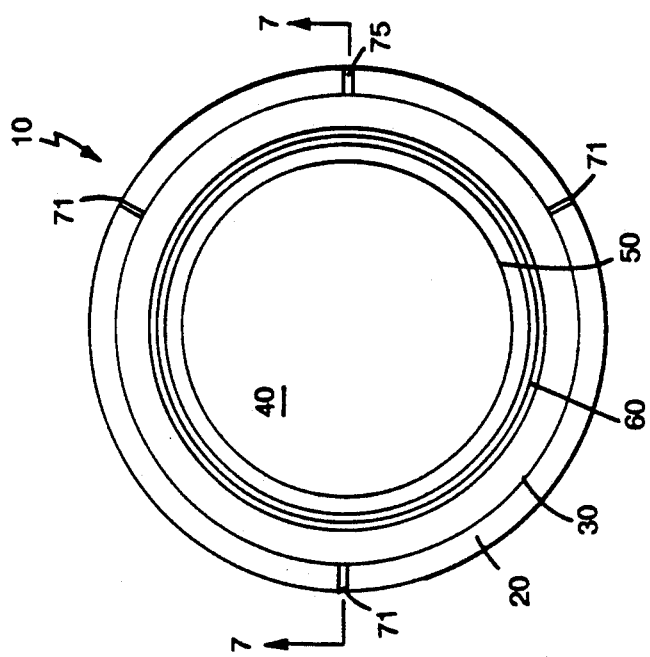
FIG. 6 is a top view diagram of another embodiment of an SOI wafer support which permits gas flow to be directed perpendicularly past the edge of the wafer to create a cylindrical stream.

Referring to FIGS. 6 and 7, an annular support 10 is provided which consists of a base 20 and cover 30 which, when assembled, provides an annular gap 60 substantially closer to the apparatus' inner radius than outer radius. The gap 60 serves as an annular vent. A supporting disk 50, preferably constructed from graphite, fits inside base 20 and supports an SOI wafer 40 which is positioned to be centered over disk 50. The base 20 and cover 30 are secured by alignment pins 71 (FIG. 6). A radial gas inlet port 75 is formed through the side walls of members 20 and 30.

The base 20 of the support 10 includes an inner support shoulder 21 which receives a mating annular flange on the disk 50. The plate 50 may also include a ring heater 70 comprised of a tungsten wire embedded within the disk in a space 80 disposed near the outer edge of the disk 50 corresponding to the diameter of the wafer. Alternatively, the ring heater may be positioned such that it resides within the disk in a position outside the diameter of the wafer. Before the strip heater movement across the wafer during ZMR, the wafer must be at a uniform temperature. Because the periphery of the wafer may have a lower base temperature than the central portions due to the thermal rolloff phenomena described above, the ring heater 70 may be used to heat the periphery and compensate for this effect and stabilize the wafer base temperature before scanning.

The base 20 provides a square groove-like inner space, bounded by walls 22, 23, 24, in which the cover, which is an inverted L-shaped in cross-section, is received. When assembled, the device provides a plenum 61 which communicates with the ambient atmosphere through the vent 60. In operation, an SOI wafer is supported by the plate 50 in a ZMR apparatus and gas flow is introduced through inlet port 75 to the plenum 61 and escapes as an annular, actually cylindrical stream, indicated by the arrows in FIG. 7, to the ambient atmosphere through vent 60. The annular stream passes in close proximity to the periphery of the wafer 40 and thereby affects the heat dissipating efficiency of the environment about the periphery which in turn allows adjustment of the heat dissipation of the wafer periphery itself. The flowing gas may further act to slightly cool the upper strip heater (not shown) above the disk 50 along the wafer's edge. This effect is also beneficial in avoiding edge defects.

In the preferred embodiment for ZMR of a 3-inch diameter wafer 40, this device is constructed from high purity Poco graphite. The maximum outer diameter of the base 20 is 4.060 inches ($L_1$) and the minimum inner diameter is 3.000 inches ($L_2$). The inner shoulder 21 provides a 0.040 inch horizontal width ($L_3$) and thereby supports the lip of a graphite plate of 3.070 inches diameter. The external vertical height of the base is 0.300 inches ($H_1$) with walls 22 and 24 having a verticle height of 0.240 inches ($H_2$). The horizontal width of wall 23 is 0.370 inches ($L_4$).

The cover 30 has an exterior vertical height of approximately 0.240 inches ($H_2$) equal to the internal verticle height of the base 20 so that when assembled the cover 30 does not vertically extend beyond the base. The gap 60 is created by cutting the cover such that its exterior cross-sectional radial width ($L_5$) is less than the interior radial width ($L_4$) of the groove in the base 20. In the embodiment for 3 inch diameter wafers, the exterior radial width of the cover is 0.345 inches ($L_5$), which leaves a gap width of 0.025 inches ($L_6$).

Holes for the alignment pins 71 are spaced 120° about the perimeter of the annulus, 0.060 inches diameter and extend from the outer wall of the base 20 into the vertical wall of the cover 30. The flow port 75 is placed 60° from two alignment pins and consists of a 0.125 diameter radial hole through the outer wall of the base and vertical wall of the cover adapted to accept a press fit aluminum oxide tube (not shown) through which the gas may be introduced.

The foregoing description of specific parameters, materials, and dimensions is intended to be illustrative rather than restricive. Many variations, additions, omissions, or rearrangements with respect to the processes and apparatus described herein are, of course, possible without departing from the spirit of the invention. Other embodiments are within the appended claims.

What is claimed is:

1. An apparatus for dissipating heat about the periphery of a semiconductor wafer during Zone Melting Recrystallization (ZMR) comprising:
    a platen; and
    a substantially annular heat sink on said platen in contact with and supporting the periphery of the wafer to dissipate a buildup of excess heat from the periphery of the wafer during ZMR.

2. The apparatus of claim 1 wherein said annular heat sink is integral with said platen.

3. The apparatus of claim 1 further comprising a chamber disposed about said annular heat sink to encapsulate an ambient gas for varying the heat dissipation efficiency of central portions of the wafer relative to the periphery of the wafer in contact with said heat sink.

4. An apparatus for dissipating heat about the periphery of a semiconductor wafer during Zone Melting Recrystallization (ZMR) comprising:
    a hollow annular member surrounding and supporting the wafer;
    an annular plenum within the perimeter of said member for conducting fluid flow within said member; and
    a substantially continuous annular vent formed in the upper surface of said member from said plenum to the ambient atmosphere for inducing a fluid stream approximately perpendicular to the plane of said member, the fluid stream thermally contacting the periphery of the wafer.

5. The apparatus of claim 4 further including a platen support spanning said member for supporting a wafer of diameter less than or equal to the inner diameter of said member.

6. An apparatus for Zone Melting Recrystallization (ZMR) of a semiconductor wafer comprising
    a platen;
    an annular thermally conductive wafer support on said platen;
    a ring heater substantially about the outer diameter of said platen for stabilizing the base temperature of the wafer;
    a heating member disposed beneath said platen for heating said platen and the wafer;
    an annular thermal shield member extending about the outer periphery of said wafer support for shielding the edge of the wafer; and
    an upper strip heater disposed above the wafer, said strip heater being in a plane parallel to the wafer plane.

7. The apparatus of claim 6 wherein said wafer support comprises a transverse opening to allow gaseous communication between the inner portion of said wafer support and the ambient atmosphere.

8. The apparatus of claim 4 further comprising an inlet traversing said member for introducing a gas from the exterior of said member to said plenum.

9. The apparatus of claim 6 wherein said platen is disk-shaped.

* * * * *